United States Patent [19]

Minami

[11] 4,053,799
[45] Oct. 11, 1977

[54] VOLTAGE MEMORY DEVICE

[75] Inventor: Shunji Minami, Katano, Japan

[73] Assignee: Matsushita Electric Industrial Co., Ltd., Osaka, Japan

[21] Appl. No.: 683,474

[22] Filed: May 5, 1976

[30] Foreign Application Priority Data

| May 8, 1975 | Japan | 50-54919 |
| Aug. 19, 1975 | Japan | 50-114529[U] |
| May 30, 1975 | Japan | 50-65491 |

[51] Int. Cl.² .................. H03K 5/20; G11C 27/02
[52] U.S. Cl. ...................... 307/351; 307/238; 307/353; 324/103 P; 328/151; 340/347 SH
[58] Field of Search ........... 307/235 B, 235 C, 235 A, 307/238, 264; 328/151; 340/347 SH, 173 CA; 324/103 P; 317/101 C, 101 CC

[56] References Cited

U.S. PATENT DOCUMENTS

| 3,463,993 | 8/1969 | Beck et al. ............. 307/238 X |
| 3,571,620 | 3/1971 | Hansen et al. .......... 307/304 X |
| 3,820,033 | 6/1974 | Iwata .................... 307/235 C |
| 3,889,133 | 6/1975 | Oka et al. .............. 307/251 |

Primary Examiner—John Zazworsky

Attorney, Agent, or Firm—Burgess, Ryan and Wayne

[57] ABSTRACT

The invention discloses an analog voltage memory device comprising an operational amplifier, a reed relay, a capacitor and a MOSFET which are so interconnected to each other that the input voltage applied to the operational amplifier is compared with the output voltage from the MOSFET applied to the noninverting input terminal of the operational amplifier, thereby providing the output voltage whose magnitude follows the level of the input voltage and holds a desired level thereof for a long time. The analog voltage memory device may further include an additional operational amplifier which compares the input voltage with the output voltage and closes the reed relay only when the input voltage is higher than the output voltage so that the source follower output voltage from the MOSFET follows only the peak of the input voltage and remains at the level of this peak. The analog memory device in accordance with the present invention will revolutionize the art of analog memory used, for instance, for storing a monitor level, a tuning level, a finally adjusted value or a peak value of the output from an analog measurement instrument.

7 Claims, 15 Drawing Figures

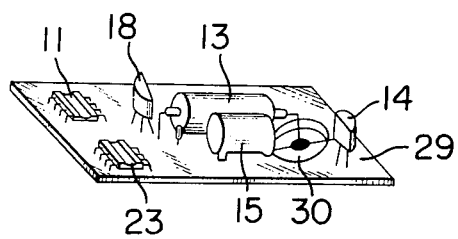
FIG. 12
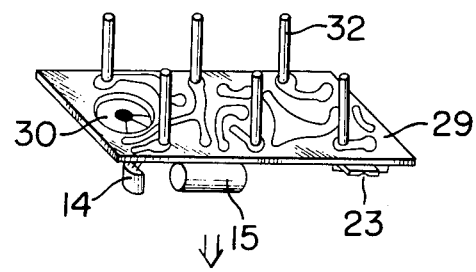
FIG. 13
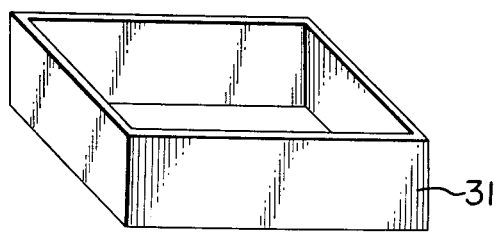
FIG. 14
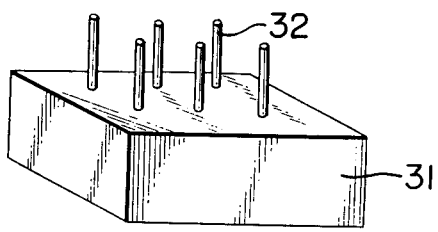

VOLTAGE MEMORY DEVICE

BACKGROUND OF THE INVENTION

The present invention relates to an analog voltage memory device which is capable of holding an input voltage signal for a considerably long time by providing an output voltage signal whose magnitude follows the level of the input voltage signal and remains at a desired level thereof.

In the art of analog arithmetic operations and measurements there has been a strong demand for devices capable of holding or storing the analog data for a considerably long time. The conventional devices for this purpose are of the type consisting of a motor and a potentiometer, of the analog memory type consisting of capacitors, magnets and the like or utilizing electrochemical reactions and of the digital type consisting of an analog-to-digital converter, a digital memory and a digital-to-analog converter. However, these conventional devices have their own inherent defects. The analog memory consisting of a motor and a potentiometer has the defects that reliability is low, life is limited because of the mechanical construction and the output is not precisely equal to the input because of mechanical tolerances and that response is slow because of motor control. The analog memories utilizing capacitors, field effect transistors and operational amplifiers have the defect that the memory holding time is too short as a defect of a memory method. The analog memories of the type using a digital-to-analog and an analog-to-digital have the defects that the resolution is rough and the memory is not held because of using a digital memory. That is, when an applied source is not provided, the memory is deleted. The analog memories type consisting of magnets or utilizing electrochemical reactions have defects that the drift of the output rises under the change of peripheral temperature and the level of the output is low.

SUMMARY OF THE INVENTION

In view of the above, one of objects of the present invention is to provide an analog memory device which is inexpensive to manufacture yet capable of holding the analog signal with a higher degree of accuracy for a considerably long time interval.

Another object of the present invention is to provide an analog voltage memory device which can provide the output voltage signal whose magnitude precisely follow the level of the input voltage signal.

A further object of the present invention is to provide an analog voltage memory device which can provide an output voltage signal whose magnitude precisely follows and remains at only the peak level of the input voltage signal.

To these and other ends, the present invention provides an analog voltage memory device comprising an input terminal, a reed relay having its one contact connected to one terminal of the input resistor, a metal oxide semiconductor field-effect transistor to be referred to as "MOSFET" in this specification for brevity and having its gate connected to the other contact of the reed relay, a nonpolarized capacitor interconnected between the gate of the MOSFET and ground, an output terminal interconnected between the source of the MOSFET and ground, and an operational amplifier for comparing the source follower output voltage from the MOSFET applied to an inverting input terminal thereof with the input voltage applied to a noninverting input terminal thereof, whereby the analog voltage memory device accepts an input voltage and provides an output voltage whose magnitude follows the level of the input voltage and remains at a desired level thereof.

According to one aspect of the present invention, an analog voltage memory device may further include an additional operational amplifier which compares the source follower output voltage from the MOSFET with the input voltage and causes the reed relay to close only when the input voltage is higher than the output voltage, whereby the analog voltage memory device provides an output voltage whose magnitude follows and remains at only the peak value of the input voltage signal.

BRIEF DESCRIPTION OF THE DRAWINGS

FIGS. 12, 13 and 14 are perspective views used for the explanation of a seventh embodiment of the present invention.

Same reference numerals are used to designate similar parts throughout the figures.

DESCRIPTION OF THE PREFERRED EMBODIMENTS

Figure 1:
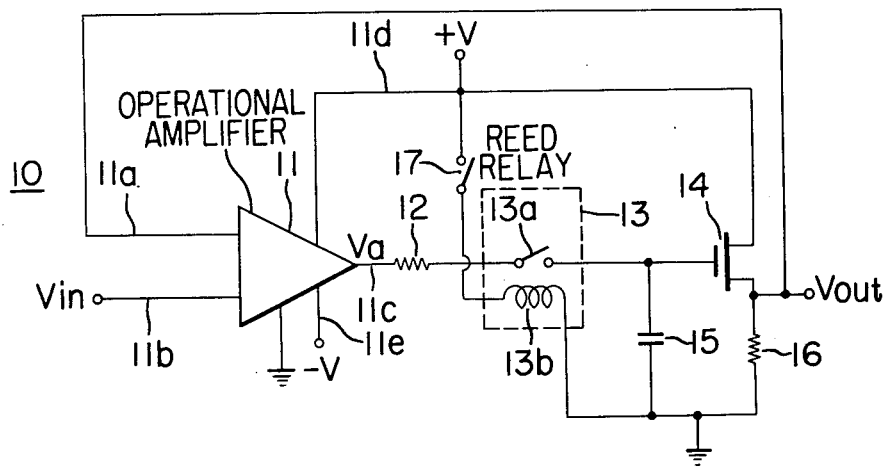
FIG. 1 is a circuit diagram of a first embodiment of the present invention.
Figure 2:
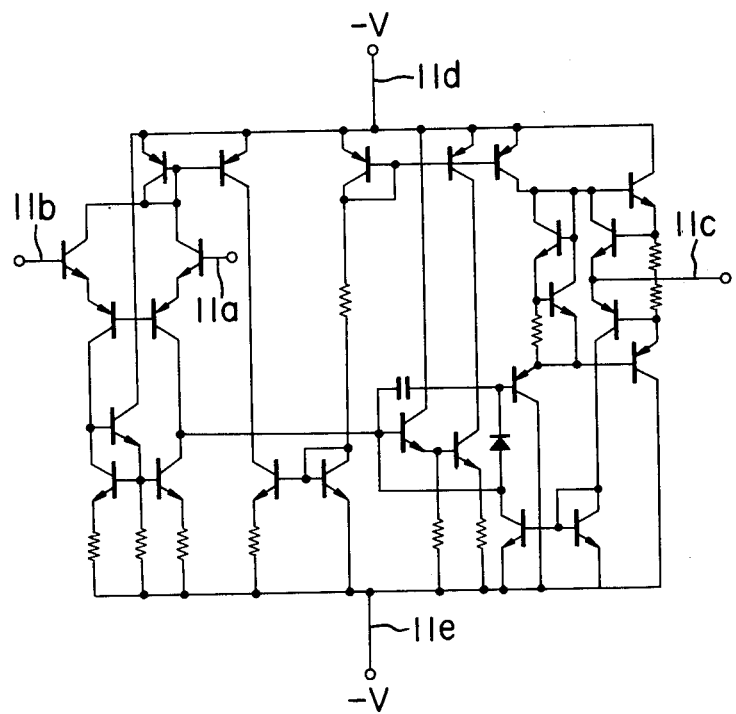
FIG. 2 is a circuit diagram of an operational amplifier used in the analog voltage memory devices in accordance with the present invention.
Figure 3:
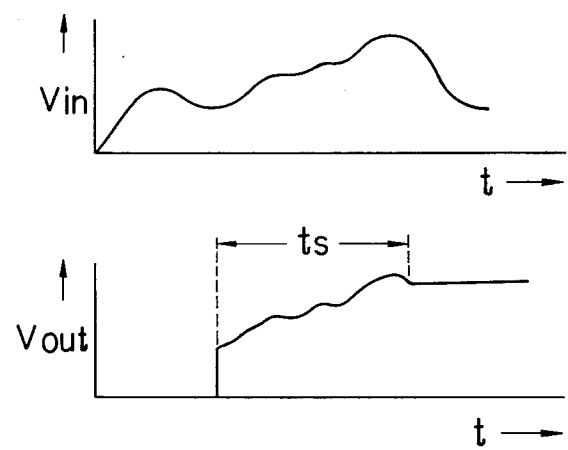
FIG. 3 is a diagram used for the explanation of the mode of operation of the first embodiment shown in FIG. 1.

First Embodiment, FIGS. 1, 2 and 3

In FIG. 1 there is shown a circuit diagram of a first embodiment of an analog voltage memory device 10 in accordance with the present invention comprising an operational amplifier 11, a reed relay 13 and a MOSFET 14. An output terminal 11c of the operational amplifier 11 is connected through an input resistor 12 to one of two relay contacts 13a of the reed relay 13, and the other contact is connected to the gate of MOSFET 14. One end of a nonpolarized electroytic capacitor 15 is connected to the gate of MOSFET 14 while the is grounded. The source of MOSFET 14 is connected to one end of an output resistor 16 whose the other end is grounded and to an inverting input terminal 11a of the operational amplifier 11. The input voltage Vin is applied to a noninverting input terminal 11b. One end of a coil 13b of the reed relay 13 is connected to a positive voltage source +V through a switch 17 while the other end is grounded. The drain of the MOSFET 14 and a positive terminal 11d of the operational amplifier 11 are also connected to the positive voltage source +V, and a negative terminal 11e is connected to a negative voltage source −V. The output voltage Vout of the analog voltage memory device 10 is derived as a source follower voltage of the MOSFET 14.

Next the mode of operation of the first embodiment with the above construction will be described. When the capacitor 15 is not charged, the output voltage Vout is zero. When the input voltage Vin applied to the input terminal 11b of the operational amplifier 11 is in excess of the output voltage Vout, the output voltage Va appears at the output terminal 11c of the operational amplifier 11 consisting of a bipolar analog integrated circuit shown in FIG. 2 and is substantially equal to the positive power source voltage +V.

In FIG. 2, 11a, 11b, 11c, 11d and 11e denote the inverting input terminal, the noninverting input terminal, the output terminal and the positive and negative power supply terminals, respectively.

When the switch 17 is closed, the coil 13b of the reed relay 13 is energized so that the relay contacts 13a are closed and consequently the capacitor 15 is charged with the output voltage Va from the operational amplifier 11. When the voltage Vc across the capacitor 15 rises to a predetermined level, the MOSFET 14 is turned on, and the voltage across the output resistor 16 is derived as the output voltage Vout. When the level of the ouput voltage Vout approaches to the level of the input voltage Vin, the output voltage Va of the operational amplifier 11 decreases and approaches to the voltage Vc across the capacitor 15. When the output voltage Va becomes equal to the voltage Vc, the capacitor 15 is not charged any longer, and the input voltage Vin becomes equal to the output voltage Vout. Thereafter even when the switch 13 is opened, the output voltage Vout remains equal to the input voltage Vin; that is, the analog voltage memory device 10 is now providing the output voltage equal in magnitude to the input voltage Vin.

When the input voltage Vin is lower than the output voltage Vout, the output voltage Va from the operational amplifier equals the negative voltage source voltage −V, and consequently the voltage Vc across the capacitor 15 becomes lower than the output voltage Va. Therefore when the switch 13 is closed, the capacitor 15 is discharged so that the output voltage Vout decreases. When the output voltage Vout approaches to the input voltage Vin, the output voltage Va from the operational amplifier 11 increases, approaching the voltage Vc across the capacitor 15. When the output voltage Va becomes equal to the voltage Vc across the capacitor 15, the discharge of the capacitor 15 is interrupted so that the output voltage Vout becomes equal to the input voltage Vin. Thereafter the analog voltage memory device 10 holds the input voltage Vin as the output voltage Vout even when switch 17 is opened.

In order to ensure the practical application of the analog voltage memory device 10, the RC time constant must be sufficiently small so that the opeation may be accomplised at such high speed as less than 10 μsec. That is, in response to the slowly changing input voltage Vin shown in FIG. 3a, the analog voltage memory device 10 provides the output voltage Vout which changes as shown in FIG. 3b when the switch 17 is closed and remains at the level of the input voltage Vin when the switch 17 is opened.

Figure 4:
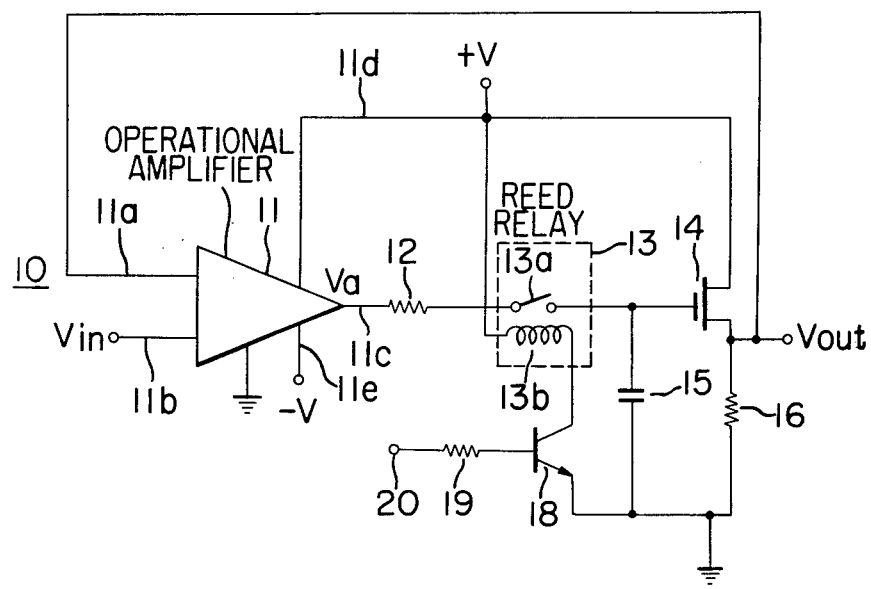
FIGS. 4 and 5 are circuit diagrams of second and third embodiments, respectively, of the present invention.

Second Embodiment, FIG. 4

The second embodiment shown in FIG. 4 is substantially imilar in construction to the first embodiment except that instead of the switch 17, a switching circuit consisting of a switching transistor 18, a resistor 19 and an input terminal 20 is used. The operation of the switching circuit is substantially similar to that of the switch 17. That is, in response to the level of the voltage applied to the input terminal 20 connected through the resistor 19 to the base of the transistor 18, the latter is turned on or off.

Figure 5:
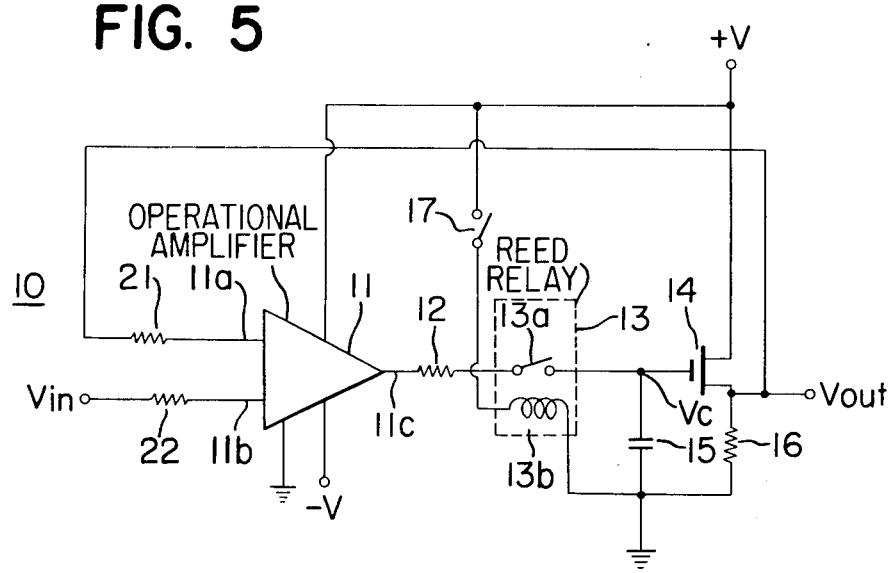

Third Embodiment, FIG. 5

The third embodiment shown in FIG. 5 is also substantially similar in construction to the first embodiment except that protective resistors 21 and 22 are connected to the input terminals 11a and 11b, respectively, of the operational amplifier 11. This arrangement can protect the operational amplifier 11 from being damaged by an excessively high input voltage Vin.

Figure 6:
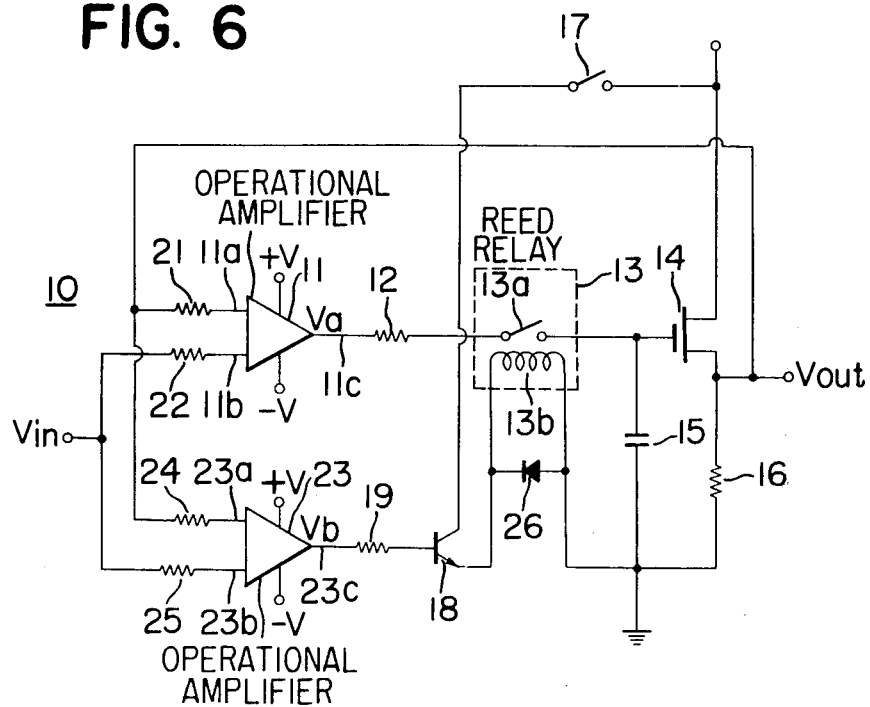
FIG. 6 is a circuit diagram of a fourth embodiment of the present invention.

Fourth Embodiment, FIGS. 6 and 7

The fourth embodiment shown in FIG. 6 responds to the input voltage Vin and provides the output voltage Vout whose magnitude follows only the peak of the input voltage Vin. The fourth embodiment is substantially similar in construction to a combination of the first, second and third embodiments described above except the additional arrangement to be described below. That is, the output terminal (23c) of a second operational amplifier 23 is connected through the resistor 19 to the base of the switching transistor 18. The source of the MOSFET 14 is connected not only to the inverting input terminal 11a of the first operational amplifier 11 through the protective resistor 21 but also to the inverting input terminal 23a of the second operational amplifier 23 through a resistor 24. The input voltage Vin is applied to both the noninverting input terminals 11b and 23b of the first and second operational amplifiers 11 and 23 through the protective resistors 22 and 25. The collector of the transistor 18 is connected through the switch 17 to the positive voltage supply +V while the emitter is connected to one end of the coil 13b of the reed relay 13. A diode 26 is connected in parallel with the coil 13b in order to prevent the reverse electromotive force.

Next further referring to FIGS. 7a and 7b, the mode of operation of the fourth embodiment will be described. When the input voltage Vin is higher than the output voltage Vout which is provided as a source follower voltage of the MOSFET 14, the output voltages Va and Vb from the first and second operational amplifiers 11 and 23 are substantially equal to the voltage +V of the positive voltage supply. Therefore the transistor 18 is turned on, and consequently the coil 13b of the reed relay 13 is energized so that the contacts 13b are closed. Therefore the capacitor 15 is charged with the output voltage Va from the first operational amplifier 11. The drain current of the MOSFET 13 increases with increase in voltage across the capacitor 15 so that the output voltage Vout also increases, approaching to the input voltage Vin. When the output voltage Vout becomes equal to the input voltage Vin, the output voltage Va from the first operational amplifier 11 is equal to the voltage Vc across the capacitor 15 while the output Vb from the second operational amplifier 23 becomes substantially zero so that the transistor 18 is turned off. As a result, the coil 13b of the reed relay 13 is deenergized, opening the contacts 13a. Therefore the voltage whose magnitude is equal to that of the voltage across the capacitor 15 when the transistor 18 is turned off remains charged across the capacitor 15, and consequently the level of the input voltage Vin when the transistor 18 is turned off is stored as the level of the output voltage Vout.

Even when the input voltage Vin drops below the output voltage Vout, the output voltage Vb from the second operational amplifier 23 remains zero or is substantially equal to the voltage −V of the negative voltage supply so that the transistor 18 remains turned off. As a result, the reed relay 13 remains opened so that the voltage across the capacitor 15 remains unchanged and consequently the output voltage Vout remains unchanged.

Figure 7A:
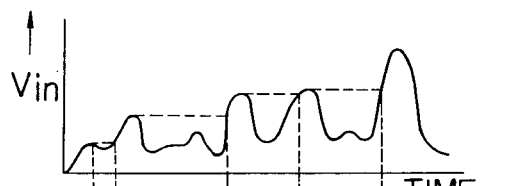
FIG. 7 is a diagram used for the explanation thereof.
Figure 7B:
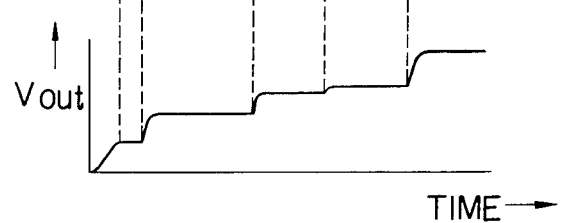

Thereafter as shown in FIG. 7b the output voltage Vout remains at the level of the highest peak of the input voltage Vin which changes as a function of time as shown in FIG. 7a, and changes only if the input voltage Vin goes higher than the previous peak level to a new higher peak level. That is, only when the level of the input voltage Vin changes to a new higher level, the transistor 18 is turned on so that the capacitor 15 is charged until Vin = Vout. However, even when the level of the input voltage Vin drops to a new level lower than the previously held level, the output voltage Vout remains at the same previous level. Therefore when a small circuit constant is selected, the source follower voltage of MOSFET 14 follows only the peak of the input voltage Vin, and remains at the level of this peak.

Figure 8:
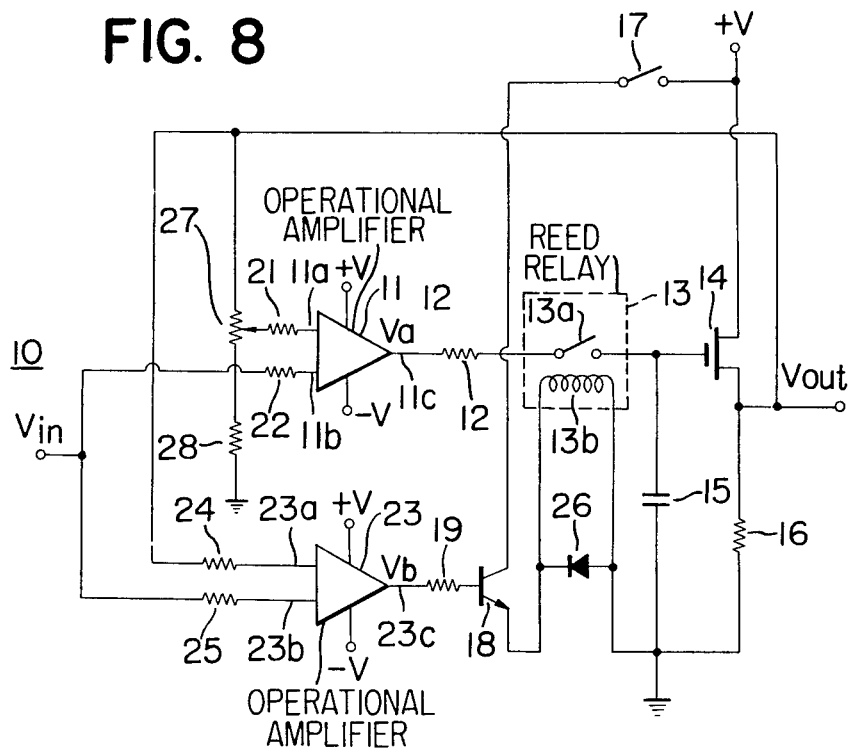
FIG. 8 is a circuit diagram of a fifth embodiment of the present invention.

Fifth Embodiment, FIG. 8

The fifth embodiment shown in FIG. 8 is substantially similar in construction to the fourth embodiment shown in FIG. 6 except that the inverting input terminal 11a of the first operational amplifier 11 is connected through the protective resistor 21 to the movable arm of a variable resistor 27 having its one fixed end connected to the source of MOSFET 14 and the other end grounded through a resistor 28. This arrangement can prevent the erratic operation that the transistor 18 will not turn off even when the output voltage Vout becomes equal to the input voltage Vin. This erratic operation tends to frequently occur when the characteristics of the first and second operational amplifiers 11 and 23 are different. However, according to the fifth embodiment, the inputs to the first and second operational amplifiers 11 and 23 can be made different in level by a few mV so that the reliable and dependable operation of the operational amplifiers 11 and 23 may be ensured without the sacrifice of the precise operation of the analog voltage memory device 10.

As described above, the analog voltage memory device in accordance with the present invention can provide the output voltage whose magnitude follows the level of the input voltage and remains at a desired level or peak level thereof.

However even when the components of the analog voltage memory device are mounted on a printed circuit board and electrically mounted, the desired function of the memory device cannot be ensured because the insulation of the printed circuit board is lower than the insulation of the capacitor 15 by the order of $10^3$ ohms. The sixth and seventh embodiments of the present invention to be described below can overcome this problem.

Figure 9:
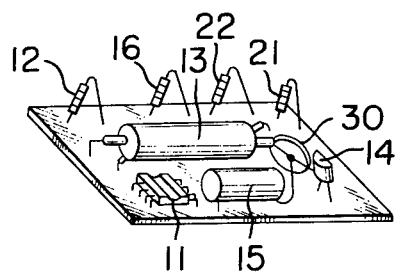
FIGS. 9, 10 and 11 are perspective views used for the explanation of a sixth embodiment of the present invention.
Figure 10:
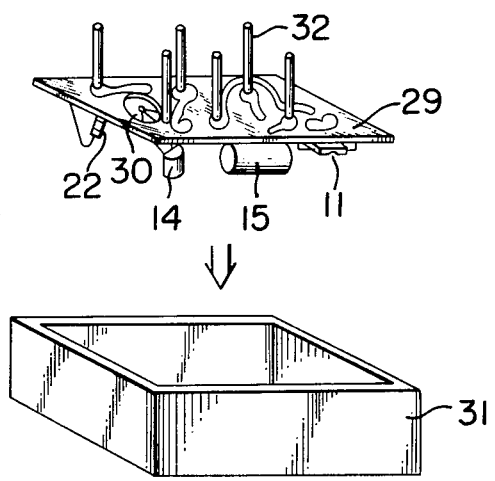
Figure 11:
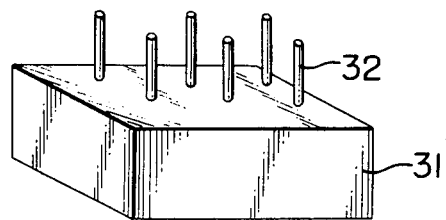

Sixth Embodiment, FIGS. 9, 10 and 11

In the sixth embodiment shown in FIGS. 9, 10 and 11, the components; that is, the resistors 12, 16, 21 and 22, the operational amplifier 11, the reed relay 13, the capacitor 15 and MOSFET 14 are mounted on a printed circuit board 29, and one terminal of the capacitor 15, the gate terminal of the MOSFET 14 and one of the relay contacts 13a of the reed relay 13 are joined together within an opening 30 formed through the printed circuit board 29 in such a way that they may be kept out of contact with the edge of the opening 30. Thus assembled printed board 29 is encased within a casing 31 as shown in FIG. 10 and then molded with high insulating resin such as exposy resin with leads or terminals 32 connected to the printed circuits on the board 29 and extended through and beyond the mold as shown in FIG. 11.

Seventh Embodiment, FIGS. 12, 13 and 14

The seventh embodiment shown in FIGS. 12, 13 and 14 is an assembly of the components of the fourth or fifth embodiment. As with the sixth embodiment, the components such as first and second operational amplifiers 11 and 23, the transistor 18, the MOSFET 14 and so on are mounted on the printed circuit board 29, and the gate terminal of the MOSFET 14, one contact of the reed relay 13 and one terminal of the capacitor 15 are joined together within the opening 30 of the board 29 in such way that they may be kept out of contact with the edge of the opening 30. Thus assembled printed circuit board 29 is encased within the casing 31 and then molded with high insulating resin (having a resistance higher than $10^5$ ohms) with leads or terminals 31 connected to the printed circuits on the board 29 and extended through and beyond the mold as shown in FIG. 14.

The analog voltage memory device in accordance with the present invention arranged and constructed in the manners described above has remarkably improved voltage memory characteristics.

For instance, when the voltage impressed across a variable capacitor used in a tuner of a color television receiver changes tens of micro volts, the color distortion occurs. However, when the analog voltage memory device in accordance with the present invention is incorporated, the color distortion due to the change in voltage applied to the capacitor can be completely eliminated. When a plastic film capacitor made of polypropylene or polystyrene film is used as the capacitor 15, the oxide film of MOSFET 14 is made thicker than 2000A and suitable high quality glass is selected to form a glass envelope of the reed relay 13, the leakage can be kept less than even 2% after such a long service as 1000 hours.

As described above, the present invention improves remarkably the analog voltage memory characteristics which render the analog memory device completely indestructible and which prevents the leakage of charges. Therefore the analog memory devices in accordance with the present invention may find a wide field of applications. For instance, they may be used for storing a monitor level, a turning level, a finally adjusted level or the peak of the output from an analog measuring instrument. Furthermore since the reed relay is used, more than tens of millions on-off operations may be possible; that is, a long service life is ensured.

What is claimed is:
1. An analog voltage memory device comprising
   a. an input resistor,
   b. a reed relay having one contact connected to one terminal of said input resistor, c. a MOSFET having the gate thereof connected to the other contact of said reed relay, d. a nonpolarized capacitor interconnected between the gate of said MOSFET and ground, e. an output resistor interconnected between the source of said MOSFET and ground, f. a first operational amplifier having a noninverting input terminal, an inverting input terminal, and an output terminal, said source being connected to said inverting input terminal, means for applying an input signal to said noninverting input terminal, said output terminal of said first operational amplifier being connected to the other terminal of said input resistor, and g. a second operational amplifier having an inverting input terminal connected to said source, a noninverting input terminal, means for applying said input signal to said noninverting input terminal, and an output terminal coupled to a coil of said reed relay for energizing said relay only when said input voltage is higher than the voltage at said source, whereby said analog voltage memory device provides an output voltage across said output resistor whose magnitude follows the peak of said input voltage.

2. An analog voltage memory device as set forth in claim 1, further comprising a switching transistor having the control electrode thereof connected to the output terminal of said second operational amplifier and one of the main electrodes thereof connected to said relay coil.

3. An analog voltage memory device as set forth in claim 2, further comprising a diode for limiting the reverse electromotive force developed by said coil, said diode being connected in parellel with said coil of said reed relay.

4. An analog voltage memory device as set forth in claim 1 wherein the voltage across said output resistor is applied to the inverting input terminal of said first operational amplifier through a variable resistor.

5. An analog voltage memory device as set forth in claim 1 wherein the components of said analog voltage memory device are mounted on a printed circuit board, the other contact of said reed relay, one terminal of said nonpolarized capacitor and the gate of said MOSFET are joined within an opening formed through said printed circuit board in such a way that they may be kept out of contact from the edge of said opening, and said printed circuit board with said components mounted thereupon is encased in a casing and molded with high insulating resin.

6. An analog voltage memory device comprising a. an input resistor, b. a reed relay having one contact connected to one terminal of said input resistor, c. a MOSFET having its gate connected to the other contact of said reed relay, d. a nonpolarized capacitor interconnected between the gate of said MOSFET and ground, e. an output resistor interconnected between the source of said MOSFET and ground, f. an operational amplifier having an inverting input terminal coupled to the source of said MOSFET and a noninverting input terminal to which an input voltage may be applied, said operational amplifier comparing the voltage across said output resistor with the input voltage to provide an amplified difference signal at an output terminal thereof, said output terminal being connected to the other terminal of said input resistor, the components of said analog voltage memory device being mounted on a printed circuit board, said other contact of said reed relay, one terminal of said capacitor and the gate of said MOSFET being joined in an opening formed through said printed circuit board in such a way that they are kept out of contact from the edge of said opening, said printed circuit board with said components mounted thereupon being encased in a casing and molded with high insulating resin, whereby said analog voltage memory device provides said voltage across said output resistor having a magnitude which closely follows the level of said input voltage.

7. An analog voltage memory device as set forth in claim 6, wherein the voltage across said output resistor is applied through a variable resistor to said inverting terminal of said operational amplifier.

* * * * *

UNITED STATES PATENT OFFICE
CERTIFICATE OF CORRECTION

Patent No. 4,053,799                    Dated October 11, 1977

Inventor(s) Shunji Minami

It is certified that error appears in the above-identified patent and that said Letters Patent are hereby corrected as shown below:

Column 2, line 55: "electroytic" should be --electrolytic--.

line 56: "the is" should be --the other is--.

Column 3, line 67: "imilar" should be --similar--.

Signed and Sealed this

Twentieth Day of June 1978

[SEAL]

Attest:

RUTH C. MASON
*Attesting Officer*

DONALD W. BANNER
*Commissioner of Patents and Trademarks*